(12) United States Patent
Wang et al.

(10) Patent No.: US 8,546,857 B1
(45) Date of Patent: Oct. 1, 2013

(54) SEMICONDUCTOR STRUCTURE AND METHOD FOR FORMING THE SAME

(75) Inventors: Jing Wang, Beijing (CN); Lei Guo, Beijing (CN); Wei Wang, Beijing (CN)

(73) Assignee: Tsinghua University, Beijing (CN)

( * ) Notice: Subject to any disclaimer, the term of this patent is extended or adjusted under 35 U.S.C. 154(b) by 0 days.

(21) Appl. No.: 13/576,937

(22) PCT Filed: Jul. 16, 2012

(86) PCT No.: PCT/CN2012/078728
§ 371 (c)(1),
(2), (4) Date: Aug. 2, 2012

(30) Foreign Application Priority Data

May 22, 2012 (CN) .......................... 2012 1 0161402

(51) Int. Cl.
*H01L 29/08* (2006.01)
*H01L 29/417* (2006.01)
*H01L 21/336* (2006.01)

(52) U.S. Cl.
USPC ............ 257/288; 257/E29.039; 257/E29.121; 257/E21.431; 438/197

(58) Field of Classification Search
USPC ........... 257/288, E29.039, E29.121, E21.431; 438/197
See application file for complete search history.

(56) References Cited

U.S. PATENT DOCUMENTS

2012/0273886 A1* 11/2012 Zhong et al. .................. 257/347

* cited by examiner

*Primary Examiner* — Victor A Mandala
(74) *Attorney, Agent, or Firm* — Houtteman Law LLC (57) ABSTRACT

A semiconductor structure and a method for forming the same are provided. The semiconductor structure comprises: a semiconductor substrate; a source region and a drain region defined in the semiconductor substrate respectively, and a trench formed in the source region and/or the drain region, in which a rare earth oxide layer is formed in the trench; a source and/or a drain formed on the rare earth oxide layer; and a channel region formed between the source and the drain. A relationship between a lattice constant a of the rare earth oxide layer and a lattice constant b of a semiconductor material of the source and/or the drain and/or the channel region is $a=(n\pm c)b$, where n is an integer, c is a mismatch ratio of lattice constants, and $0<c\leq 15\%$.

16 Claims, 4 Drawing Sheets

SEMICONDUCTOR STRUCTURE AND METHOD FOR FORMING THE SAME

CROSS-REFERENCE TO RELATED APPLICATION

This application claims priority to and benefits of Chinese Patent Application Serial No. 201210161402.0, filed with the State Intellectual Property Office of P. R. China on May 22, 2012, the entire contents of which are incorporated herein by reference.

FIELD

The present disclosure relates to semiconductor design and fabrication field, and more particularly to a semiconductor structure and a method for forming the same.

BACKGROUND

With a development of a semiconductor technology, a feature size of a metal-oxide-semiconductor field-effect transistor (MOSFET) is continuously scaled down. When the feature size reaches a deep submicron or even a nanometer order of magnitude, a series of degeneration effects generally appear, which do not exist or are not obvious when the feature size is a large size, such as a threshold voltage roll-off, a drain induced barrier lowering (DIBL) or an overlarge leakage current.

In order to solve above problems, one solution is that by producing a corresponding stress in a specific region of a semiconductor device according to a type thereof, a carrier mobility of the device may be enhanced, thus improving a performance of the device. In a deep submicron or nanometer device, the suitable stress is important to improve the performance of the device. Conventional methods for producing the stress comprises: adding a substitutional element in a source region and a drain region to change a lattice constant by epitaxial growth or ion implantation, depositing a stress cap layer after forming a device structure, etc. One of the most primary disadvantages of these conventional methods lies in complicated process and difficulty in adjusting stress type. Moreover, with a further scaling down of the feature size of the device, it is difficult to produce an effective stress by the conventional methods, and thus it is hard to significantly improve the performance of the semiconductor device.

SUMMARY

The present disclosure is aimed to solve at least one of the problems, particularly problems of overlarge leakage current in a device with small size, difficulty in producing a stress, complicated process and unsatisfactory stress effect.

According to an aspect of the present disclosure, a semiconductor structure is provided. The semiconductor structure comprises: a semiconductor substrate; a source region and a drain region defined in the semiconductor substrate respectively, and a trench formed in the source region and/or the drain region, in which a rare earth oxide layer is formed in the trench; a source and/or a drain formed on the rare earth oxide layer; and a channel region formed between the source and the drain, in which a relationship between a lattice constant a of the rare earth oxide layer and a lattice constant b of a semiconductor material of the source and/or the drain and/or the channel region is $a=(n\pm c)b$, where n is an integer, c is a mismatch ratio of lattice constants, and $0<c\leq 15\%$.

In one embodiment, a depth of the trench is not less than 5 nm. To ensure the lattice constant of a surface layer of the rare earth oxide layer not to be affected by the semiconductor substrate and to ensure a larger stress to be induced, the depth of the trench may not be too small.

In one embodiment, the material of the rare earth oxide layer comprises any one of $(Gd_{1-x}Er_x)_2O_3$, $(Gd_{1-x}Nd_x)_2O_3$, $(Er_{1-x}Nd_x)_2O_3$, $(Er_{1-x}La_x)_2O_3$, $(Pr_{1-x}La_x)_2O_3$, $(Pr_{1-x}Nd_x)_2O_3$, $(Pr_{1-x}Gd_x)_2O_3$ and a combination thereof, where x is within a range from 0 to 1.

In one embodiment, the rare earth oxide layer is formed by epitaxial growth.

In one embodiment, the source and/or the drain and the channel region are formed by crystal growth, which may help to obtain a high quality crystal.

In one embodiment, a thickness of the rare earth oxide layer is equal to or greater than a depth of the trench, and the channel region is formed on the semiconductor substrate.

In one embodiment, a thickness of the rare earth oxide layer is less than a depth of the trench, and a region of the semiconductor substrate between the source and the drain is the channel region.

In one embodiment, a barrier layer is formed at a portion of each side wall of the trench where the rare earth oxide layer is formed, and the source and/or the drain are formed on the rare earth oxide layer and on the barrier layer.

According to another aspect of the present disclosure, a method for forming a semiconductor structure is provided. The method comprises steps of: S01: providing a semiconductor substrate; S02: defining a source region and a drain region in the semiconductor substrate respectively, and forming a trench in the source region and/or the drain region; S03: forming a rare earth oxide layer in the trench; S04: forming a source and/or a drain on the rare earth oxide layer, and forming a channel region between the source and the drain. A relationship between a lattice constant a of the rare earth oxide layer and a lattice constant b of a semiconductor material of the source and/or the drain and/or the channel region is $a=(n\pm c)b$, where n is an integer, c is a mismatch ratio of lattice constants, and $0<c\leq 15\%$.

In one embodiment, a depth of the trench is not less than 5 nm. To ensure the lattice constant of a surface layer of the rare earth oxide layer not to be affected by the semiconductor substrate and to ensure a larger stress to be induced, the depth of the trench may not be too small.

In one embodiment, the material of the rare earth oxide layer comprises any one of $(Gd_{1-x}Er_x)_2O_3$, $(Gd_{1-x}Nd_x)_2O_3$, $(Er_{1-x}Nd_x)_2O_3$, $(Er_{1-x}La_x)_2O_3$, $(Pr_{1-x}La_x)_2O_3$, $(Pr_{1-x}Nd_x)_2O_3$, $(Pr_{1-x}Gd_x)_2O_3$ and a combination thereof, where x is within a range from 0 to 1.

In one embodiment, the rare earth oxide layer is formed by epitaxial growth.

In one embodiment, Step S04 comprises growing crystals on the rare earth oxide layer to form the source and the drain respectively and growing crystals on a region of the semiconductor substrate between the source and the drain to form the channel region. The source and/or the drain and the channel region are formed by crystal growth, which may help to obtain a high quality crystal.

In one embodiment, in Step S03, a thickness of the rare earth oxide layer is equal to or greater than the depth of the trench. Therefore, Step S04 comprises: growing crystals on the rare earth oxide layer to form the source and the drain respectively and growing crystals on a region of the semiconductor substrate between the source and the drain to form the channel region.

In one embodiment, in Step S03, a thickness of the rare earth oxide layer is less than the depth of the trench. Therefore, in an alternative embodiment, by controlling a growing condition of the rare earth oxide layer, the rare earth oxide layer may be preferentially vertically grown up from a bottom of the trench so as to prevent holes from being formed in the trench during a growth process. In another alternative embodiment, Step S03 may comprises steps of: S031: forming a barrier layer in the trench; S032: removing a portion of the barrier layer formed on a bottom of the trench and reserving a portion of the barrier layer formed at each sidewall of the trench; S033: growing the rare earth oxide layer in the trench; S034: removing a portion of the barrier layer formed at each sidewall of the trench and uncovered by the rare earth oxide layer; and Step S04 comprises: forming the source and/or the drain on the rare earth oxide layer and on the barrier layer.

With the semiconductor structure and the method for forming the same according to an embodiment of the present disclosure, the rare earth oxide layer is formed under the source region and/or the drain region of the semiconductor device. A lattice constant of a rare earth oxide is about twice that of widely used semiconductor materials such as Si, Ge, and group III-V compound semiconductor materials, which means the crystalline rare earth oxides are lattice coincident on these semiconductor materials. The crystalline rare earth oxides can be epitaxially grown on Si, Ge, and some group III-V compound semiconductor materials. By adjusting an element type and content of the rare earth oxide, the lattice constant thereof may be conveniently adjusted to be slightly larger or smaller than twice that of the material of the source region, the drain region or the channel region, thus producing a stress in the source and/or the drain and the channel region of the semiconductor device during an epitaxial growth process because of a lattice constant difference. Advantages of the present disclosure are listed as follows.

(1) Because the lattice constant of the rare earth oxide is varied with a type and a content of a rare earth element in the rare earth oxide, by adjusting the element type and content of the rare earth oxide, a required stress may be induced in the source and/or the drain and the channel region.

(2) Because a maximum stress in the semiconductor structure is located under the source and/or the drain, which is immediately adjacent to the channel region, compared with a conventional stress cap layer or a stress-engineered trench isolation structure, the stress induced in the channel region by the rare earth oxide in the present disclosure is bigger, and a carrier mobility of the device may be more significantly and effectively enhanced.

(3) By using a crystal characteristic of the rare earth oxide, a conventional complicated method for producing a stress may be replaced by crystal epitaxial growth, thus greatly simplifying a process flow.

Additional aspects and advantages of the embodiments of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of the disclosure will become apparent and more readily appreciated from the following descriptions taken in conjunction with the drawings in which.

DETAILED DESCRIPTION

Embodiments of the present disclosure will be described in detail in the following descriptions, examples of which are shown in the accompanying drawings, in which the same or similar elements and elements having same or similar functions are denoted by like reference numerals throughout the descriptions. The embodiments described herein with reference to the accompanying drawings are explanatory and illustrative, which are used to generally understand the present disclosure. The embodiments shall not be construed to limit the present disclosure.

It is to be understood that phraseology and terminology used herein with reference to device or element orientation (such as, terms like "longitudinal", "lateral", "front", "rear", "right", "left", "lower", "upper", "horizontal", "vertical", "above", "below", "up", "top", "bottom" as well as derivative thereof such as "horizontally", "downwardly", "upwardly", etc.) are only used to simplify description of the present invention, and do not alone indicate or imply that the device or element referred to must have or operated in a particular orientation.

It should be noted that, by forming a rare earth oxide layer under at least one of a source region and a drain region, a lattice constant of a rare earth oxide may be adjusted by adjusting an element type and content of the rare earth oxide. Therefore, a stress may be induced in the source and/or the drain and the channel region of the semiconductor device during an epitaxial growth process of the rare earth oxide layer, because of lattice constant differences between the rare earth oxide layer and the channel region, between the rare earth oxide layer and the source region and/or between the rare earth oxide layer and the drain region. For the convenience of description, in following embodiments, only a structure with the rare earth oxide layer formed under both the source region and the drain region will be described as an example. A structure with the rare earth oxide layer formed under either the source region or the drain region, which shall not be described herein, may be implemented with reference to these embodiments.

Figure 1:
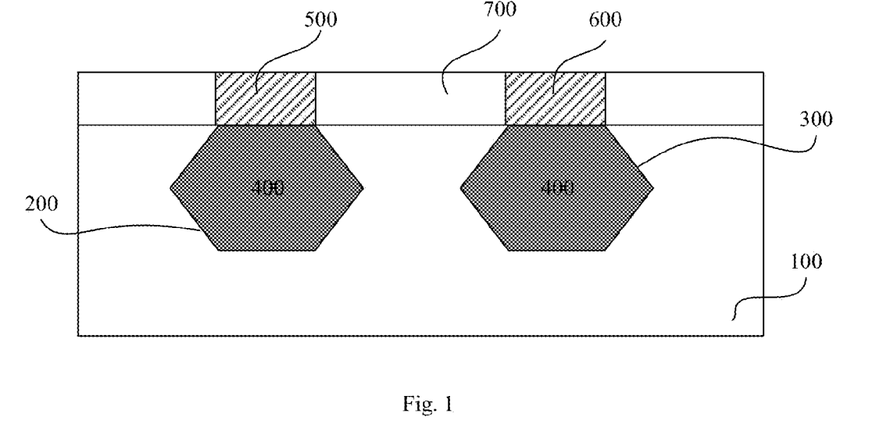
FIG. 1 is a cross-sectional view of a semiconductor structure according to a first embodiment of the present disclosure.

FIG. 1 is a cross-sectional view of a semiconductor structure according to a first embodiment of the present disclosure. As shown in FIG. 1, the semiconductor structure comprises: a semiconductor substrate 100; a source region and a drain region defined in the semiconductor substrate 100 respectively; a trench 200 and a trench 300 formed in the source region and the drain region respectively; rare earth oxide layers 400 formed in the trench 200 and the trench 300 respectively; a source 500 and a drain 600 formed on the rare earth oxide layers 400 in the trench 200 and the trench 300 respectively; and a channel region 700 formed between the source 500 and the drain 600.

In one embodiment, a material of the semiconductor substrate 100 comprises single crystal Si (silicon), single crystal Ge (germanium), SiGe (silicon-germanium) with any Ge content, any group III-V compound semiconductor, SOI (silicon-on-insulator), GeOI (germanium-on-insulator) or other semiconductor substrate materials.

To ensure the lattice constant of a surface layer of the rare earth oxide layer 400 not to be affected by the semiconductor substrate 100 and to ensure a larger stress to be induced, a depth of each of the trench 200 and the trench 300 may not be too small. In one embodiment, the depth of each of the trench 200 and the trench 300 may be not less than 5 nm. Each of the trench 200 and the trench 300 may have an inverted Ω shape, a rectangular shape or a U shape. The inverted Ω shape is preferred, because compared with the rectangular shape and the U shape, a rare earth oxide filled in each of the trench 200 and the trench 300 with the inverted Ω shape may be closer to a region of the semiconductor substrate 100 under the channel region 700, so as to compress or tense the region of the semiconductor substrate 100 via a wedge structure adjacent to the region of the semiconductor substrate 100, which may help to induce a stress in the channel region 700.

In one embodiment, a material of the rare earth oxide layer 400 may comprise various rare earth oxides and a combination thereof, such as any one of $(Gd_{1-x}Er_x)_2O_3$, $(Gd_{1-x}Nd_x)_2O_3$, $(Er_{1-x}Nd_x)_2O_3$, $(Er_{1-x}La_x)_2O_3$, $(Pr_{1-x}La_x)_2O_3$, $(Pr_{1-x}Nd_x)_2O_3$, $(Pr_{1-x}Gd_x)_2O_3$ and a combination thereof, where x is within a range from 0 to 1. Specifically, the material of the rare earth oxide layer 400 may comprise $Er_2O_3$, $Gd_2O_3$, $Nd_2O_3$, $Pr_2O_3$, $La_2O_3$, etc. Because the lattice constant of the rare earth oxide is varied with a type and a content of a rare earth element in the rare earth oxide, by adjusting the element type and the content of the rare earth oxide, the lattice constant of the rare earth oxide layers 400 under both the source 500 and the drain 600 may be adjusted to be matched with the lattice constant of the material of the source 500 and/or the drain 600 and/or the channel region 700, thus producing a tunable stress in the source 500 and/or the drain 600 and the channel region 700. In some embodiments, so called "match" means that a relationship between a lattice constant a of the rare earth oxide layer 400 and a lattice constant b of a semiconductor material of the source 500 and/or the drain 600 and/or the channel region 700 is $a=(n\pm c)b$, where n is an integer, c is a mismatch ratio of lattice constants, and $0<c\leq15\%$. For example, in one embodiment, the material of each of the source 500, the drain 600 and the channel region 700 may be Si or Ge, and by adjusting the constituent of the rare earth oxide, the lattice constant of the rare earth oxide layer 400 may be adjusted to be slightly larger or smaller than twice that of Si or Ge. If a is just an integral multiple of b, a stress may not be induced in the source 500 and the drain 600; if a is slightly larger than the integral multiple of b, a stress may be induced in the source 500 and the drain 600, and may be presented as a compressive stress in the channel region 700 via transmission, thus raising a hole mobility in the channel region 700; and if a is slightly smaller than the integral multiple of b, a stress may be induced in the source 500 and the drain 600, and may be presented as a tensile stress in the channel region 700 via transmission, thus raising an electron mobility in the channel region 700. Generally, the mismatch ratio of lattice constants is within 15%.

In a preferred embodiment, the rare earth oxide layer 400 is formed by epitaxial growth, such as an ultra-high vacuum chemical vapor deposition (UHVCVD), an atomic layer deposition (ALD), a metal-organic chemical vapor deposition (MOCVD) or a molecular beam epitaxy (MBE). Because a maximum stress in the semiconductor structure is located under the source 500 and the drain 600, which is immediately adjacent to the channel region 700, compared with a conventional stress cap layer or a stress-engineered trench isolation structure, the stress induced in the channel region 700 by the rare earth oxide layer 400 is bigger, and a carrier mobility of the device may be more significantly and effectively enhanced.

In this embodiment, a thickness of the rare earth oxide layer 400 in the trench 200 is substantially equal to or greater than a depth of the trench 200, a thickness of the rare earth oxide layer 400 in the trench 300 is substantially equal to or greater than a depth of the trench 300, and the channel region 700 is formed on a region of the semiconductor substrate 100 between the trench 200 and the trench 300. A material of each of the source 500, the drain 600 and the channel region 700 may comprise single crystal Si, single crystal Ge, SiGe with any Ge content, any group III-V compound semiconductor and any group II-VI compound semiconductor. Preferably, the source 500, the drain 600 and the channel region 700 may be all formed by crystal growth, which may help to obtain a high quality crystal. It should be noted that thicknesses of the source 500, the drain 600 and the channel region 700 may not be overlarge, or else the stress in the channel region 700 induced by the rare earth oxide layer 400 will be released and it will not help to form a source and a drain with low resistance so as to cause a poor performance of the device. In an alternative embodiment, a material of each of the source 500 and the drain 600 may also be a metal. For a CMOS device having a metal source and a metal drain, the stress is mainly induced in a region of the semiconductor substrate 100 under the channel region 700 by the rare earth oxide layer 400, and then transmitted to the channel region 700. By using the metal source and the metal drain, a series resistance of the source and the drain may be reduced, which may be combined with a stress effect in the channel region to further increase a drive current of the device.

Figure 2:
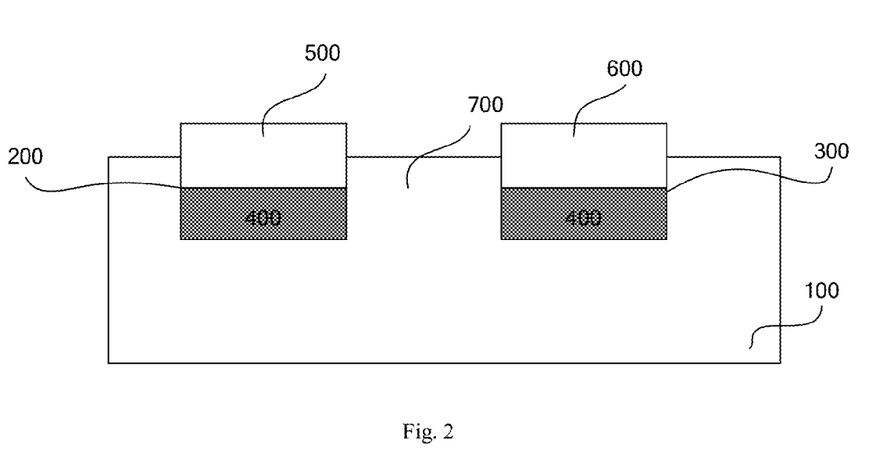
FIG. 2 is a cross-sectional view of a semiconductor structure according to a second embodiment of the present disclosure.

FIG. 2 is a cross-sectional view of a semiconductor structure according to a second embodiment of the present disclosure. The semiconductor structure shown in FIG. 2 is different from the semiconductor structure shown in FIG. 1 in that: the thickness of the rare earth oxide layer 400 in the trench 200 is less than the depth of the trench 200, the thickness of the rare earth oxide layer 400 in the trench 300 is less than the depth of the trench 300, and a region of the semiconductor substrate 100 between the source 500 and the drain 600 is the channel region 700. In addition, in order to allow the rare earth oxide layers 400 to be preferentially vertically grown up from bottoms of the trench 200 and the trench 300 respectively, so as to prevent holes from being formed in the trench 200 and the trench 300 during a growth process, each of the trench 200 and the trench 300 may preferably have a rectangular shape. Portions of the semiconductor structure according to the second embodiment of the present disclosure identical with those of the semiconductor structure according to the first embodiment of the present disclosure shall not be described herein.

Figure 3:
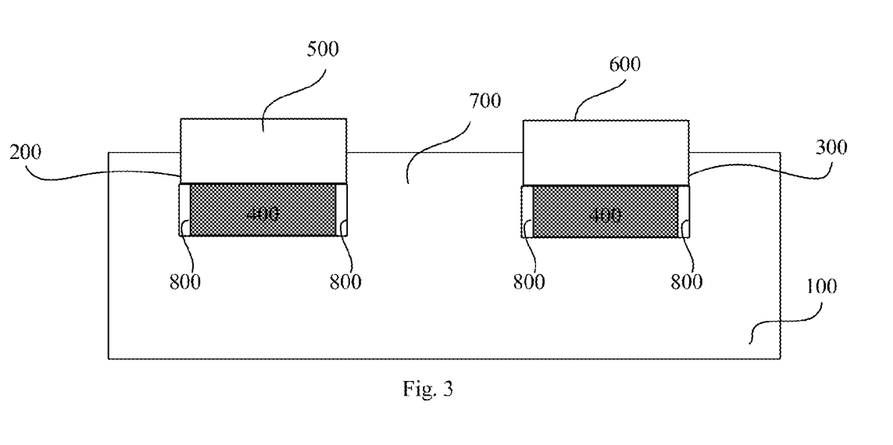
FIG. 3 is a cross-sectional view of a semiconductor structure according to a third embodiment of the present disclosure.

FIG. 3 is a cross-sectional view of a semiconductor structure according to a third embodiment of the present disclosure. The semiconductor structure shown in FIG. 3 is different from the semiconductor structure shown in FIG. 2 in that: a barrier layer 800 is formed at a portion of each side wall of the trench 200 and the trench 300 where the rare earth oxide layer 400 is formed, and the source 500 and the drain 600 are formed on the rare earth oxide layer 400 and the barrier layer 800 in the trench 200 and the trench 300 respectively. Portions of the semiconductor structure according to the third embodiment of the present disclosure identical with those of the semiconductor structures according to the first and second embodiments of the present disclosure shall not be described herein.

Figure 4:
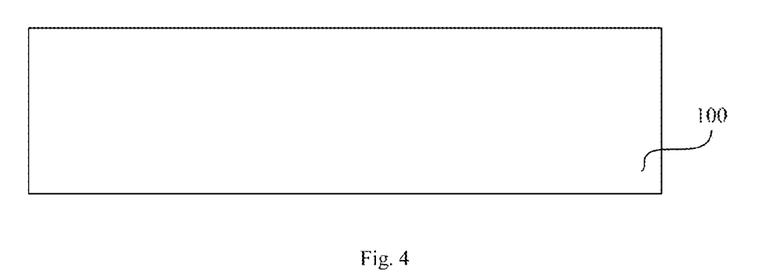
FIGS. 4-6 are cross-sectional views of intermediate statuses of the semiconductor structure formed in steps of a method for forming the semiconductor structure according to the first embodiment of the present disclosure.
Figure 5:
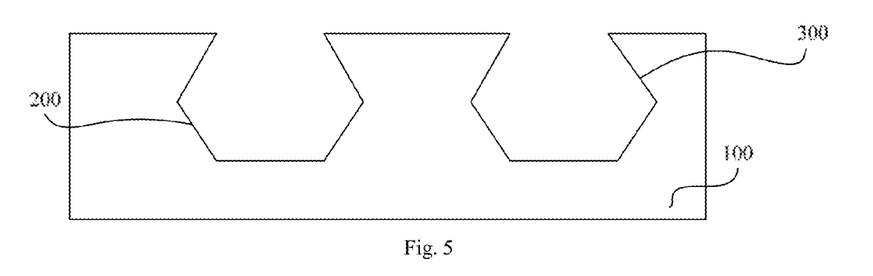
Figure 6:
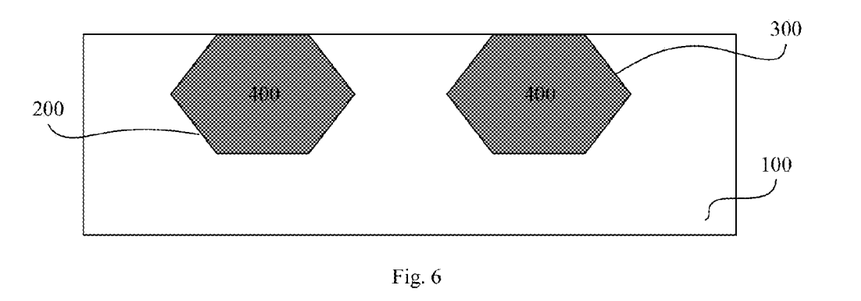

According to another aspect of the present disclosure, a method for forming the above semiconductor structure is provided. FIGS. 4-6 are cross-sectional views of intermediate statuses of the semiconductor structure formed in steps of a method for forming the semiconductor structure according to the first embodiment of the present disclosure. The method comprises following steps.

Step S101: a semiconductor substrate 100 is provided, as shown in FIG. 4. In one embodiment, a material of the semiconductor substrate 100 may comprise single crystal Si, single crystal Ge, SiGe with any Ge content, any group III-V compound semiconductor, SOI, GeOI or other semiconductor substrate materials.

Step S102: a source region and a drain region are defined in the semiconductor substrate 100 respectively, and a trench 200 and a trench 300 are formed in the source region and the drain region respectively, as shown in FIG. 5. In one embodiment, the source region and the drain region are defined in the semiconductor substrate 100 respectively, and then the trench 200 and the trench 300 with an inverted Ω shape, a rectangular shape, a U shape or other shapes are formed by etching the semiconductor substrate 100 respectively. The inverted Ω shape is preferred, because compared with the rectangular shape and the U shape, a rare earth oxide filled in each of the trench 200 and the trench 300 with the inverted Ω shape may be closer to a region of the semiconductor substrate 100 under the channel region 700, so as to compress or tense the region of the semiconductor substrate 100 via a wedge structure adjacent to the region of the semiconductor substrate 100, which may help to produce a stress in the channel region 700. To ensure the lattice constant of a surface layer of the rare earth oxide layer 400 not to be affected by the semiconductor substrate 100 and to ensure a larger stress to be induced, a depth of each of the trench 200 and the trench 300 may not be too small. In one embodiment, the depth of each of the trench 200 and the trench 300 may be not less than 5 nm.

Step S103: rare earth oxide layers 400 are formed in the trench 200 and the trench 300 respectively. A thickness of the rare earth oxide layer 400 in the trench 200 is substantially equal to or greater than a depth of the trench 200, and a thickness of the rare earth oxide layer 400 in the trench 300 is substantially equal to or greater than a depth of the trench 300, as shown in FIG. 6. In one embodiment, a material of the rare earth oxide layer 400 may comprise various rare earth oxides and a combination thereof, such as any one of $(Gd_{1-x}Er_x)_2O_3$, $(Gd_{1-x}Nd_x)_2O_3$, $(Er_{1-x}Nd_x)_2O_3$, $(Er_{1-x}La_x)_2O_3$, $(Pr_{1-x}La_x)_2O_3$, $(Pr_{1-x}Nd_x)_2O_3$, $(Pr_{1-x}Gd_x)_2O_3$ and a combination thereof, where x is within a range from 0 to 1. Specifically, the material of the rare earth oxide layer 400 may comprise $Er_2O_3$, $Gd_2O_3$, $Nd_2O_3$, $Pr_2O_3$, $La_2O_3$, etc. In a preferred embodiment, the rare earth oxide layer 400 is formed by epitaxial growth, such as UHVCVD, ALD, MOCVD or MBE. Because a maximum stress in the semiconductor structure is located under the source and the drain, which is immediately adjacent to the channel region, compared with a conventional stress cap layer or a stress-engineered trench isolation structure, the stress induced in the channel region by the rare earth oxide is bigger, and a carrier mobility of the device may be more significantly and effectively enhanced. In an alternative embodiment, after the rare earth oxide layers 400 are formed in the two trenches 200, 300 respectively, a device surface may be polished to obtain a flat surface, for example, by a chemical mechanical polishing (CMP).

Step S104: a source 500 and a drain 600 are formed on the rare earth oxide layers 400 in the trench 200 and the trench 300 respectively, and a channel region 700 is formed on a region of the semiconductor substrate 100 between the source 500 and the drain 600, as shown in FIG. 1. A material of each of the source 500, the drain 600 and the channel region 700 may comprise single crystal Si, single crystal Ge, SiGe with any Ge content, any group III-V compound semiconductor and any group II-VI compound semiconductor. Preferably, the source 500, the drain 600 and the channel region 700 may be all formed by crystal growth, that is, crystals are grown on the rare earth oxide layers 400 in the trench 200 and the trench 300 to form the source 500 and the drain 600 respectively and crystals are grown on a region of the semiconductor substrate 100 between the source 500 and the drain 600 to form the channel region 700, which may help to obtain a high quality crystal. It should be noted that thicknesses of the source 500, the drain 600 and the channel region 700 may not be overlarge, or else the stress in the channel region 700 induced by the rare earth oxide layer 400 will be released and it will not help to form a source and a drain with low resistance so as to cause a poor performance of the device.

Because the lattice constant of the rare earth oxide is varied with a type and a content of a rare earth element in the rare earth oxide, by adjusting the element type and content of the rare earth oxide, the lattice constant of the material of each of the rare earth oxide layers 400 under the source 500 and the drain 600 may be adjusted to be matched with the lattice constant of the material of the source 500 and/or the drain 600 and/or the channel region 700, that is, the lattice constant of the material of each of the rare earth oxide layers 400 may be adjusted to be slightly larger or smaller than twice that of the material of the source 500 and/or the drain 600 and/or the channel region 700, thus producing a tunable stress in the source 500, the drain 600 and the channel region 700 because of a lattice constant difference.

Alternatively, Step S104 may comprise: forming a metal source 500 and a metal drain 600 on the rare earth oxide layers 400 in the trench 200 and the trench 300 respectively. For a CMOS device having a metal source and a metal drain, the stress is mainly induced in a region of the semiconductor substrate 100 under the channel region 700 by the rare earth oxide layer 400, and then transmitted to the channel region 700. By using the metal source and the metal drain, a series resistance of the source and the drain may be reduced, which may be matched with a stress effect in the channel region to further increase a drive current of the device.

In one embodiment, a method for forming the semiconductor structure herein above by a MOCVD process will be described below in detail.

Step S101': a semiconductor substrate is provided. In one embodiment, a material of the semiconductor substrate may be Si with a preferred orientation of <110> or <111>.

Step S102': a source region and a drain region are defined in the semiconductor substrate respectively, and then trenches are formed in the source region and the drain region by etching (for example, dry etching followed by wet etching) the semiconductor substrate respectively. Each trench may have an inverted Ω shape and a depth of 30 nm.

Step S103': a rare earth oxide layer is formed in each trench by MOCVD. A thickness of the rare earth oxide layer is substantially equal to the depth of each trench. In this embodiment, for a NMOS device, with $(CpMe)_3Er$ and $Gd(OCMe_2CH_2OMe)_3$ with a suitable ratio as the rare earth element sources and with $O_2$ as a reactant, the rare earth oxide is grown by MOCVD at a temperature of 850° C. The rare earth oxide $(Gd_{1-x}Er_x)_2O_3$ layer with a thickness of 30 nm is formed, where x is within the range from 0 to 1 and is varied with the ratio of the rare earth element sources. Then, the device surface is treated by CMP to get a planarization surface.

Step S104': a source material and a drain material are grown on the rare earth oxide layers in the two trenches respectively, and a channel region material is grown on a region of the semiconductor substrate between the source and the drain. Because a lattice constant of rare earth oxide $(Gd_{1-x}Er_x)_2O_3$ is slightly smaller than twice that of Si, a stress may be induced in the source and the drain formed in the Si substrate, and may be presented as a tensile stress in the channel region via transmission, thus raising an electron mobility in the channel region. After the source, the drain and the channel region are formed, subsequent processes are performed, for example, a gate stack and a side wall are formed, the source and the drain are implanted and activated, and contacts are formed. A transistor having a rare earth oxide layer under the source and the drain is finally formed.

Figure 7:
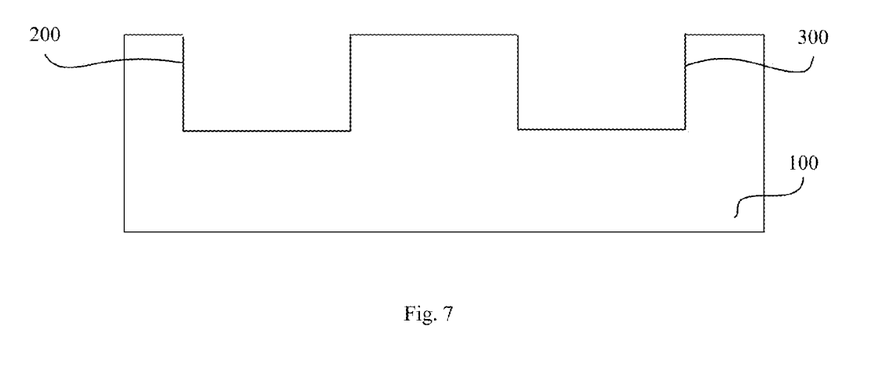
FIGS. 7-8 are cross-sectional views of intermediate statuses of the semiconductor structure formed in steps of a method for forming the semiconductor structure according to the second embodiment of the present disclosure.
Figure 8:
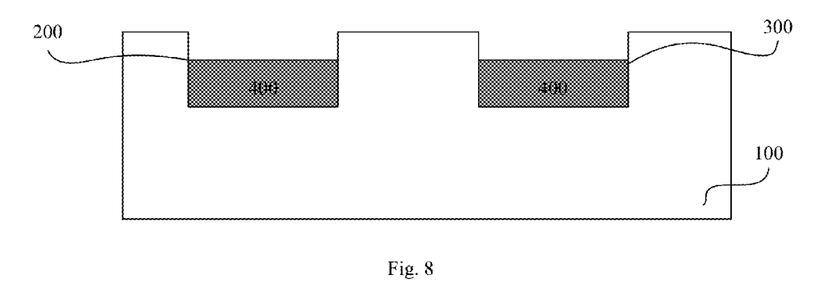

FIGS. 7-8 are cross-sectional views of intermediate statuses of the semiconductor structure formed in steps of a method for forming the semiconductor structure according to the second embodiment of the present disclosure. For conciseness purpose, only steps different from those of the method for forming the semiconductor structure according to the first embodiment of the present disclosure are described below in detail. The method comprises following steps.

Step S201 and Step S202 are substantially the same as Step S101 and Step S102 respectively. In one embodiment, each of the trench 200 and the trench 300 may have a rectangular shape, as shown in FIG. 7.

Step S203: rare earth oxide layers 400 are formed in the trench 200 and the trench 300 respectively. A thickness of the rare earth oxide layer 400 in the trench 200 is less than a depth of the trench 200, and a thickness of the rare earth oxide layer 400 in the trench 300 is less than a depth of the trench 300, as shown in FIG. 7. In one embodiment, a material of the rare earth oxide layer 400 may comprise various rare earth oxides and a combination thereof, such as any one of $(Gd_{1-x}Er_x)_2O_3$, $(Gd_{1-x}Nd_x)_2O_3$, $(Er_{1-x}Nd_x)_2O_3$, $(Er_{1-x}La_x)_2O_3$, $(Pr_{1-x}La_x)_2O_3$, $(Pr_{1-x}Nd_x)_2O_3$, $(Pr_{1-x}Gd_x)_2O_3$ and a combination thereof, where x is within a range from 0 to 1. Specifically, the material of the rare earth oxide layer 400 may comprise $Er_2O_3$, $Gd_2O_3$, $Nd_2O_3$, $Pr_2O_3$, $La_2O_3$, etc. In a preferred embodiment, the rare earth oxide layer 400 is formed by epitaxial growth, such as UHVCVD, ALD, MOCVD or MBE. Moreover, by controlling a growing condition of the rare earth oxide layer 400 (for example, a pressure or a temperature), the rare earth oxide layers 400 may be preferentially vertically grown up from bottoms of the trench 200 and the trench 300 respectively, but hardly laterally grown at sidewalls of the trench 200 and the trench 300 respectively, thus preventing holes from being formed in the trench 200 and the trench 300. Furthermore, by controlling a growing time of the rare earth oxide layer 400, the rare earth oxide layers 400 may be formed in a part of the trench 200 and a part of the trench 300 respectively. Because the maximum stress in the semiconductor structure is located under the source and the drain, which is immediately adjacent to the channel region, compared with the conventional stress cap layer or the stress-engineered trench isolation structure, the stress induced in the channel region by the rare earth oxide 400 is bigger, and the carrier mobility of the device may be more significantly and effectively enhanced.

Step S204: a source 500 and a drain 600 are formed on the rare earth oxide layers 400 in the trench 200 and the trench 300 respectively, and a channel region 700 is formed in a region of the semiconductor substrate 100 between the source 500 and the drain 600, as shown in FIG. 2. In one embodiment, a material of each of the source 500, the drain 600 and the channel region 700 may comprise single crystal Si, single crystal Ge, SiGe with any Ge content, any group III-V compound semiconductor and any group II-VI compound semiconductor. Preferably, the source 500 and the drain 600 may be formed by crystal growth, which may help to obtain a high quality crystal. The channel region 700 may be formed by doping the region of the semiconductor substrate 100 between the source 500 and the drain 600. It should be noted that thicknesses of the source 500, the drain 600 and the channel region 700 may not be overlarge, or else the stress in the channel region 700 induced by the rare earth oxide layer 400 will be released and it will not help to form a source and a drain with low resistance so as to cause a poor performance of the device.

In one embodiment, a method for forming the semiconductor structure herein above by a MOCVD process will be described below in detail.

Step S201': a semiconductor substrate is provided. In one embodiment, a material of the semiconductor substrate may be Si with a preferred orientation of <110> or <111>.

Step S202': a source region and a drain region are defined in the semiconductor substrate respectively, and then trenches are formed in the source region and the drain region by etching (for example, dry etching followed by wet etching) the semiconductor substrate respectively. Each trench may have an inverted Ω shape and a depth of 30 nm.

Step S203': a rare earth oxide layer is formed in each trench by MOCVD. A thickness of the rare earth oxide layer is less than the depth of each trench. In this embodiment, for a NMOS device, with $(CpMe)_3Er$ and $Gd(OCMe_2CH_2OMe)_3$ with a suitable ratio as the rare earth element sources and with $O_2$ as a reactant, the rare earth oxide is grown by MOCVD at a temperature of 850° C. The rare earth oxide $(Gd_{1-x}Er_x)_2O_3$ layer with a thickness of 15 nm is formed, where x is within the range from 0 to 1 and is varied with the ratio of the rare earth element sources.

FIGS. 9-13 are cross-sectional views of intermediate statuses of the semiconductor structure formed in steps of a method for forming the semiconductor structure according to the third embodiment of the present disclosure. For conciseness purpose, only steps different from those of the method for forming the semiconductor structure according to the first embodiment of the present disclosure are described below in detail. The method comprises following steps.

Figure 9:
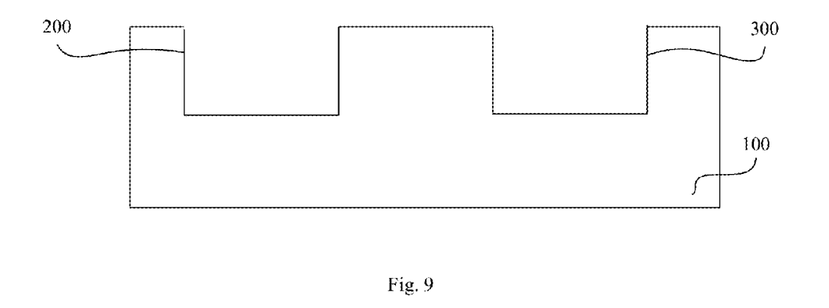
FIGS. 9-13 are cross-sectional views of intermediate statuses of the semiconductor structure formed in steps of a method for forming the semiconductor structure according to the third embodiment of the present disclosure.

Step S301 and Step S302 are substantially the same as Step S101 and Step S102 respectively. In one embodiment, each of the trench 200 and the trench 300 may have a rectangular shape, as shown in FIG. 9.

Step S303 may comprise following steps.

Figure 10:
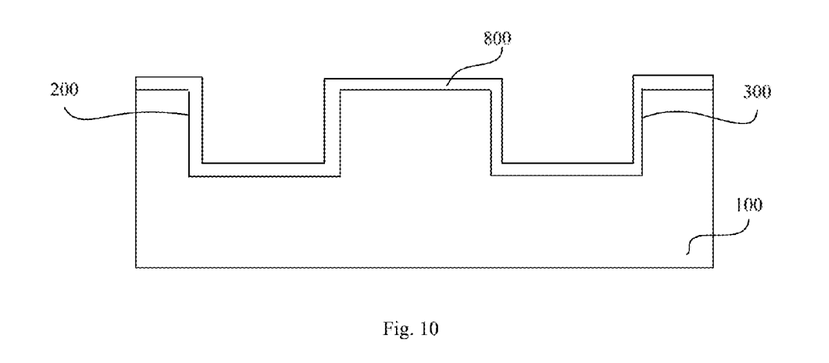

S3031: barrier layers 800 are formed in the trench 200 and the trench 300 respectively, as shown in FIG. 10. A material of each barrier layer 800 may be SiN, $SiO_2$ or other commonly used isolating dielectrics.

Figure 11:
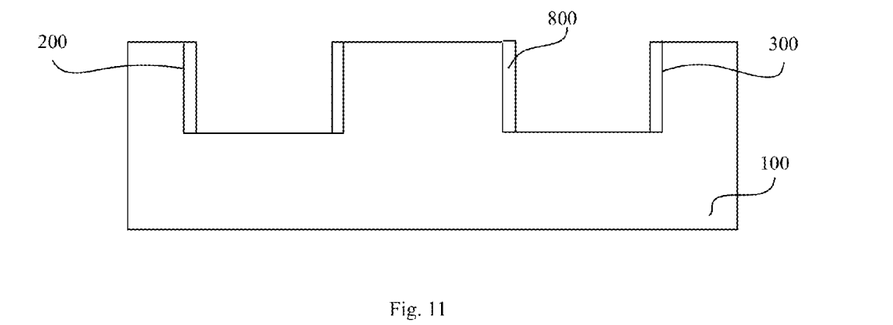

S3032: portions of the barrier layers 800 formed on bottoms of the trench 200 and the trench 300 are removed respectively, and portions of the barrier layers 800 formed at each sidewall of the trench 200 and the trench 300 are reserved respectively, as shown in FIG. 11. Specifically, an anisotropic etching may be performed for each barrier layer 800. By controlling etching process conditions, bottoms of the trench 200 and the trench 300 are exposed, while the portions of the barrier layers 800 formed at each sidewall of the trench 200 and the trench 300 is reserved respectively.

Figure 12:
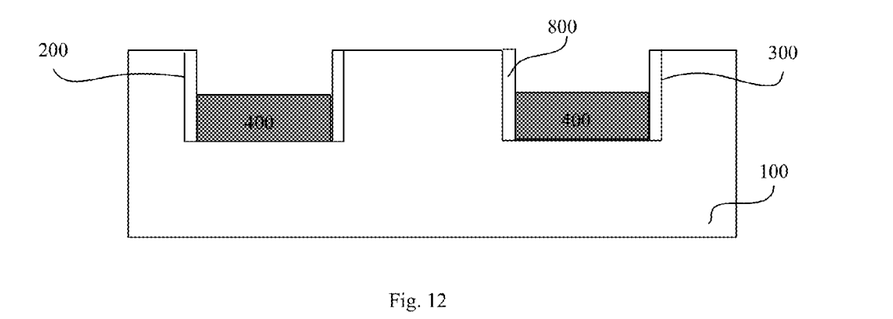

S3033: the rare earth oxide layers 400 are grown in the trench 200 and the trench 300 respectively. A thickness of the rare earth oxide layer 400 in the trench 200 is less than a depth of the trench 200, and a thickness of the rare earth oxide layer 400 in the trench 300 is less than a depth of the trench 300, as shown in FIG. 12. Because each sidewall of the trench 200 and the trench 300 is protected by the barrier layer 800, the rare earth oxide layers 400 merely grow up from bottoms of the trench 200 and the trench 300 respectively.

Figure 13:
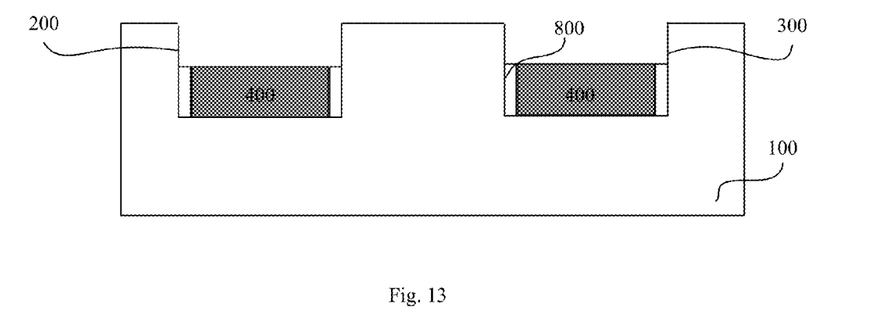

S3034: portions of the barrier layers 800 formed at each sidewall of the trench 200 and the trench 300 and uncovered by the rare earth oxide layers 400 are removed respectively, as shown in FIG. 13. For example, the exposed portion of each barrier layer 800 may be removed by selective etching.

In Step S303, the rare earth oxide layers 400 are formed in the trench 200 and the trench 300 respectively. Because the maximum stress in the semiconductor structure is located under the source and the drain, which is immediately adjacent to the channel region, compared with the conventional stress cap layer or the stress-engineered trench isolation structure, the stress induced in the channel region by the rare earth oxide 400 is bigger, and the carrier mobility of the device may be more significantly and effectively enhanced.

Step S304: the source 500 and the drain 600 are formed on the rare earth oxide layers 400 and remaining barrier layers 800 in the trench 200 and the trench 300 respectively, and a channel region 700 is formed in a region of the semiconductor substrate 100 between the source 500 and the drain 600, as shown in FIG. 3. In one embodiment, a material of each of the source 500, the drain 600 and the channel region 700 may comprise single crystal Si, single crystal Ge, SiGe with any Ge content, any group III-V compound semiconductor and any group II-VI compound semiconductor. Preferably, the source 500 and the drain 600 may be formed by crystal growth, which may help to obtain a high quality crystal. The channel region 700 may be formed by doping the region of the semiconductor substrate 100 between the source 500 and the drain 600. It should be noted that thicknesses of the source 500, the drain 600 and the channel region 700 may not be overlarge, or else the stress in the channel region 700 induced by the rare earth oxide layer 400 will be released and it will not help to form a source and a drain with low resistance so as to cause a poor performance of the device.

With the semiconductor structure and the method for forming the same according to embodiments of the present disclosure, the rare earth oxide layer is formed under the source and/or the drain. By adjusting the element type and content of the rare earth oxide layer, the lattice constant of the rare earth oxide layer may be adjusted. Because of lattice constant differences between the rare earth oxide layer and the channel region, between the rare earth oxide layer and the source region and/or between the rare earth oxide layer and the drain region, a tunable stress is induced in the channel region of the semiconductor device during the epitaxial growth process, thus significantly improving the carrier mobility of the semiconductor device. Moreover, by using a crystal characteristic of the rare earth oxide, a conventional complicated method for producing a stress may be replaced by crystal growth, thus greatly simplifying a process flow.

Reference throughout this specification to "an embodiment", "some embodiments", "one embodiment", "an example", "a specific example", or "some examples" means that a particular feature, structure, material, or characteristic described in connection with the embodiment or example is included in at least one embodiment or example of the disclosure. Thus, the appearances of the phrases such as "in some embodiments", "in one embodiment", "in an embodiment", "in an example", "in a specific example", or "in some examples" in various places throughout this specification are not necessarily referring to the same embodiment or example of the disclosure. Furthermore, the particular features, structures, materials, or characteristics may be combined in any suitable manner in one or more embodiments or examples.

Although explanatory embodiments have been shown and described, it would be appreciated by those skilled in the art that changes, alternatives, and modifications may be made in the embodiments without departing from spirit and principles of the disclosure. Such changes, alternatives, and modifications all fall into the scope of the claims and their equivalents.

What is claimed is:

1. A semiconductor structure, comprising:
a semiconductor substrate;
a source region and a drain region defined in the semiconductor substrate respectively, and a trench formed in the source region and/or the drain region, wherein a rare earth oxide layer is formed in the trench;
a source and/or a drain formed on the rare earth oxide layer; and
a channel region formed between the source and the drain;
wherein a relationship between a lattice constant a of the rare earth oxide layer and a lattice constant b of a semiconductor material of the source and/or the drain and/or the channel region is a=(n±c)b, where n is an integer, c is a mismatch ratio of lattice constants, and 0<c≤15%.

2. The semiconductor structure according to claim 1, wherein a depth of the trench is not less than 5 nm.

3. The semiconductor structure according to claim 1, wherein the material of the rare earth oxide layer comprises any one of $(Gd_{1-x}Er_x)_2O_3$, $(Gd_{1-x}Nd_x)_2O_3$, $(Er_{1-x}Nd_x)_2O_3$, $(Er_{1-x}La_x)_2O_3$, $(Pr_{1-x}La_x)_2O_3$, $(Pr_{1-x}Nd_x)_2O_3$, $(Pr_{1-x}Gd_x)_2O_3$ and a combination thereof, where x is within a range from 0 to 1.

4. The semiconductor structure according to claim 1, wherein the rare earth oxide layer is formed by epitaxial growth.

5. The semiconductor structure according to claim 1, wherein the source and/or the drain and the channel region are formed by crystal growth.

6. The semiconductor structure according to claim 1, wherein a thickness of the rare earth oxide layer is equal to or greater than a depth of the trench, and the channel region is formed on the semiconductor substrate.

7. The semiconductor structure according to claim 1, wherein a thickness of the rare earth oxide layer is less than a depth of the trench, and a region of the semiconductor substrate between the source and the drain is the channel region.

8. The semiconductor structure according to claim 7, wherein a barrier layer is formed at a portion of each sidewall of the trench where the rare earth oxide layer is formed, and the source and/or the drain are formed on the rare earth oxide layer and on the barrier layer.

9. A method for forming a semiconductor structure, comprising steps of:
S01: providing a semiconductor substrate;
S02: defining a source region and a drain region in the semiconductor substrate respectively, and forming a trench in the source region and/or the drain region;
S03: forming a rare earth oxide layer in the trench;
S04: forming a source and/or a drain on the rare earth oxide layer, and forming a channel region between the source and the drain;

wherein a relationship between a lattice constant a of the rare earth oxide layer and a lattice constant b of a semiconductor material of the source and/or the drain and/or the channel region is a=(n±c)b, where n is an integer, c is a mismatch ratio of lattice constants, and $0 < c \le 15\%$.

10. The method according to claim 9, wherein a depth of the trench is not less than 5 nm.

11. The method according to claim 9, wherein the material of the rare earth oxide layer comprises any one of $(Gd_{1-x}Er_x)_2O_3$, $(Gd_{1-x}Nd_x)_2O_3$, $(Er_{1-x}Nd_x)_2O_3$, $(Er_{1-x}La_x)_2O_3$, $(Pr_{1-x}La_x)_2O_3$, $(Pr_{1-x}Nd_x)_2O_3$, $(Pr_{1-x}Gd_x)_2O_3$ and a combination thereof, where x is within a range from 0 to 1.

12. The method according to claim 9, wherein the rare earth oxide layer is formed by epitaxial growth.

13. The method according to claim 9, wherein in Step S03, a thickness of the rare earth oxide layer is equal to or greater than the depth of the trench.

14. The method according to claim 13, wherein Step S04 comprises: growing crystals on the rare earth oxide layer to form the source and the drain respectively and growing crystals on a region of the semiconductor substrate between the source and the drain to form the channel region.

15. The method according to claim 9, wherein in Step S03, a thickness of the rare earth oxide layer is less than the depth of the trench.

16. The method according to claim 15, wherein Step S03 comprises:
- S031: forming a barrier layer in the trench;
- S032: removing a portion of the barrier layer formed on a bottom of the trench and reserving a portion of the barrier layer formed at each sidewall of the trench;
- S033: growing the rare earth oxide layer in the trench;
- S034: removing a portion of the barrier layer formed at each sidewall of the trench and uncovered by the rare earth oxide layer; and
- Step S04 comprises: forming the source and/or the drain on the rare earth oxide layer and on the barrier layer.

* * * * *